(12) United States Patent
Lee et al.

(10) Patent No.: US 9,390,945 B2
(45) Date of Patent: Jul. 12, 2016

(54) SEMICONDUCTOR DEVICE AND METHOD OF DEPOSITING UNDERFILL MATERIAL WITH UNIFORM FLOW RATE

(75) Inventors: KyungHoon Lee, Kyunggi-Do (KR); JoungIn Yang, Seoul (KR); Sang Mi Park, Kyounggi-do (KR); DaeSik Choi, Seoul (KR); YiSu Park, Kyoungki-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 501 days.

(21) Appl. No.: 13/466,945

(22) Filed: May 8, 2012

(65) Prior Publication Data

US 2013/0299995 A1     Nov. 14, 2013

(51) Int. Cl.
*H01L 21/00* (2006.01)
*H01L 21/56* (2006.01)
*H01L 23/00* (2006.01)

(52) U.S. Cl.
CPC .............. *H01L 21/563* (2013.01); *H01L 24/83* (2013.01); *H01L 24/16* (2013.01); *H01L 24/29* (2013.01); *H01L 2224/131* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/16225* (2013.01); *H01L 2224/16238* (2013.01); *H01L 2224/26175* (2013.01); *H01L 2224/2919* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/81191* (2013.01); *H01L 2224/81203* (2013.01); *H01L 2224/81815* (2013.01); *H01L 2224/83104* (2013.01); *H01L 2224/83385* (2013.01); *H01L 2224/92125* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01)

(58) Field of Classification Search
CPC ........ H01L 21/563; H01L 24/16; H01L 24/29; H01L 24/83
See application file for complete search history.

(56) References Cited

U.S. PATENT DOCUMENTS

| | | | | |
|---|---|---|---|---|
| 6,015,722 A | * | 1/2000 | Banks et al. | 438/108 |
| 6,074,897 A | * | 6/2000 | Degani et al. | 438/115 |
| 6,177,728 B1 | * | 1/2001 | Susko et al. | 257/737 |

(Continued)

*Primary Examiner* — Nicholas Tobergte
(74) *Attorney, Agent, or Firm* — Robert D. Atkins; Patent Law Group: Atkins and Associates, P.C.

(57) ABSTRACT

A semiconductor device has a substrate and insulating layer formed over a surface of the substrate. A first conductive layer is formed over the surface of the substrate. A second conductive layer is formed over an opposing surface of the substrate. A conductive via is formed through the substrate. An opening is formed in the insulating layer while leaving the first conductive layer intact. The opening narrows with a non-linear side or linear side. The opening can have a rectangular shape. A semiconductor die is mounted over the surface of the substrate. An underfill material is deposited between the semiconductor die and substrate. The opening in the insulating layer reduces a flow rate of the underfill material proximate to the opening. The flow rate of the underfill material proximate to the opening is substantially equal to a flow rate of the underfill material away from the opening.

26 Claims, 13 Drawing Sheets

(56) References Cited

U.S. PATENT DOCUMENTS

| | | | |
|---|---|---|---|
| 7,400,048 B2* | 7/2008 | Choi | 257/778 |
| 8,358,002 B2* | 1/2013 | Sutardja | 257/698 |
| 2002/0060084 A1* | 5/2002 | Hilton | H01L 21/563 174/523 |
| 2004/0184226 A1* | 9/2004 | Hall | 361/683 |
| 2008/0079134 A1 | 4/2008 | Lin et al. | |
| 2008/0164587 A1 | 7/2008 | Park et al. | |
| 2008/0277802 A1 | 11/2008 | Tsai et al. | |
| 2010/0038780 A1 | 2/2010 | Daubenspeck et al. | |
| 2011/0147919 A1* | 6/2011 | Sutardja | 257/706 |

* cited by examiner

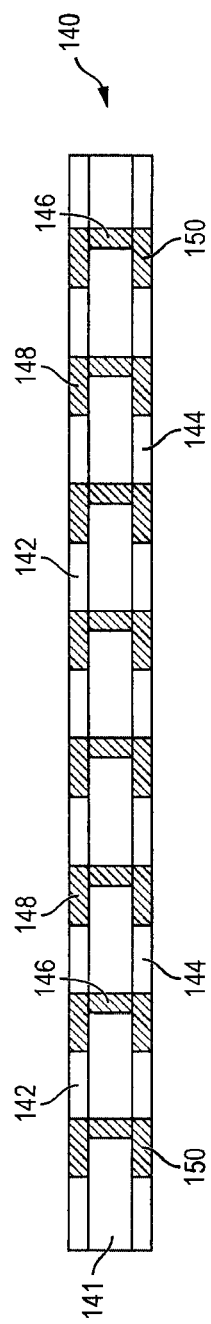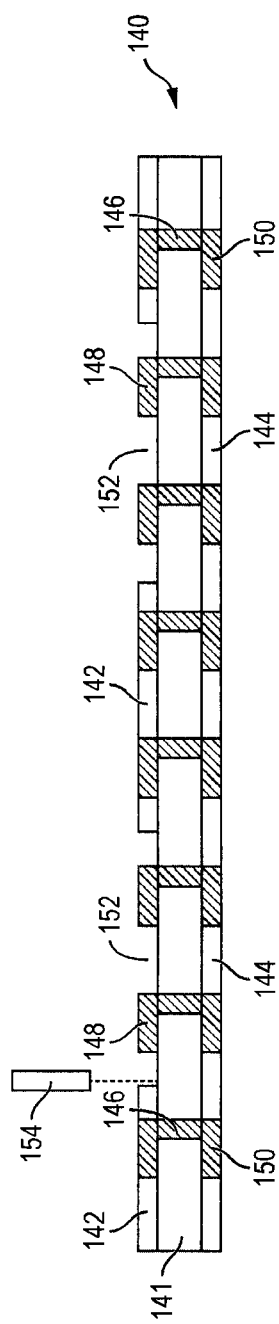

SEMICONDUCTOR DEVICE AND METHOD OF DEPOSITING UNDERFILL MATERIAL WITH UNIFORM FLOW RATE

FIELD OF THE INVENTION

The present invention relates in general to semiconductor devices and, more particularly, to a semiconductor device and method of depositing an underfill material between a semiconductor die and substrate with a uniform flow rate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor die is commonly mounted over a substrate with an underfill material deposited between the semiconductor die and substrate, as shown in FIG. 1a. Semiconductor die 10 is mounted to substrate 12 with bumps 14. A dispensing needle 16 injects underfill material 18 into area 20 between semiconductor die 10 and substrate 12. Dispensing needle 16 moves between reference point 20 and reference point 22 across a width of semiconductor die 10 while injecting underfill material 18 into area 20, as shown in FIG. 1b.

The underfill material 18 is known to build up unevenly in area 20 due to an non-uniform flow rate. Bumps 14 are disposed around a perimeter of semiconductor die 10. No bumps are formed within central region 26 of semiconductor die site 28. The presence of bumps 14 around the perimeter of semiconductor die 10 reduces the volume to fill in that area and increases the effective flow rate of underfill material 18 around the bumps. The portion of area 20 without bumps 14, i.e., central region 26, has more volume to fill, which reduces the effective flow rate of underfill material 18. The flow rate of underfill material 18 around bumps 14 is greater than the flow rate of underfill material 18 in central region 26, as shown in FIG. 1b. The non-uniform flow rate of underfill material 18 can cause bleed-out around semiconductor die 10 and form voids in the underfill material. The voids in underfill material 18 can reduce the reliability of semiconductor die 10.

SUMMARY OF THE INVENTION

A need exists to maintain a uniform flow rate of underfill material between a semiconductor die and substrate. Accordingly, in one embodiment, the present invention is a method of making a semiconductor device comprising the steps of providing a substrate, forming an insulating layer over a first surface of the substrate, forming a plurality of openings in the insulating layer, providing a semiconductor die, mounting the semiconductor die over the first surface of the substrate, and depositing an underfill material between the semiconductor die and substrate. The openings in the insulating layer reduce a flow rate of the underfill material proximate to the openings.

In another embodiment, the present invention is a method of making a semiconductor device comprising the steps of providing a substrate, forming an opening in the substrate, providing a semiconductor die, mounting the semiconductor die over the substrate, and depositing an underfill material between the semiconductor die and substrate. The opening in the substrate alters a flow rate of the underfill material proximate to the opening.

In another embodiment, the present invention is a method of making a semiconductor device comprising the steps of providing a substrate, forming an opening in the substrate, mounting a semiconductor die over the substrate, and depositing an underfill material between the semiconductor die and substrate and into the opening in the substrate.

In another embodiment, the present invention is a semiconductor device comprising a substrate including an opening formed in the substrate. A semiconductor die is mounted over the substrate. An underfill material is deposited between the semiconductor die and substrate and into the opening in the substrate.

BRIEF DESCRIPTION OF THE DRAWINGS

FIGS. 5a-5k illustrate a process of depositing an underfill material between a semiconductor die and substrate having openings for a uniform flow rate.

DETAILED DESCRIPTION OF THE DRAWINGS

Figure 1A:
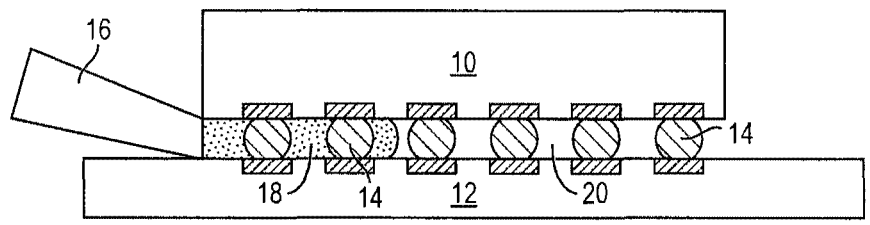
FIGS. 1a-1b illustrate an underfill material deposited between a semiconductor die and substrate with a non-uniform flow rate.
Figure 1B:
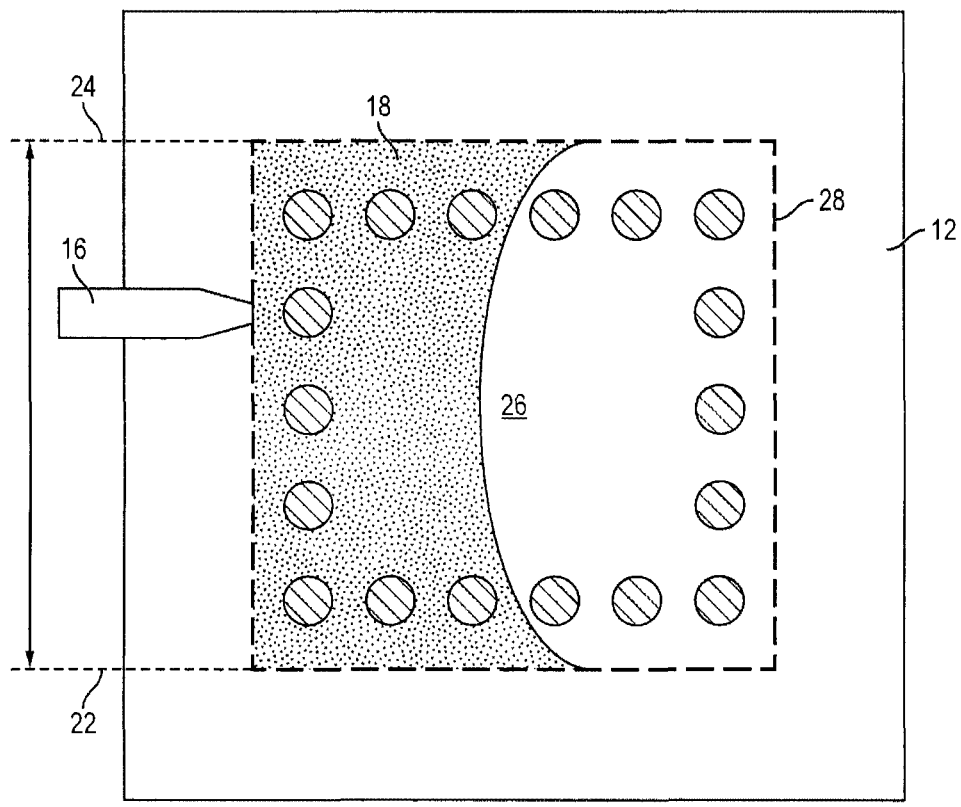

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
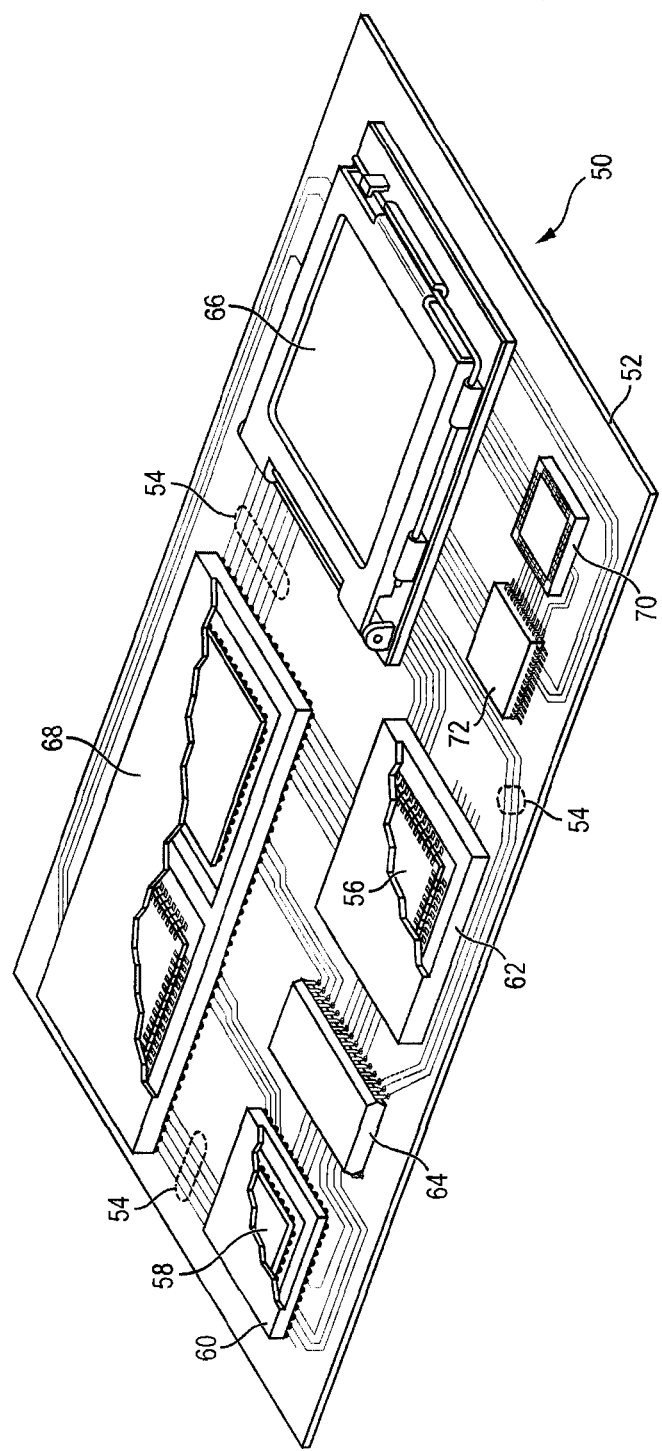
FIG. 2 illustrates a printed circuit board (PCB) with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
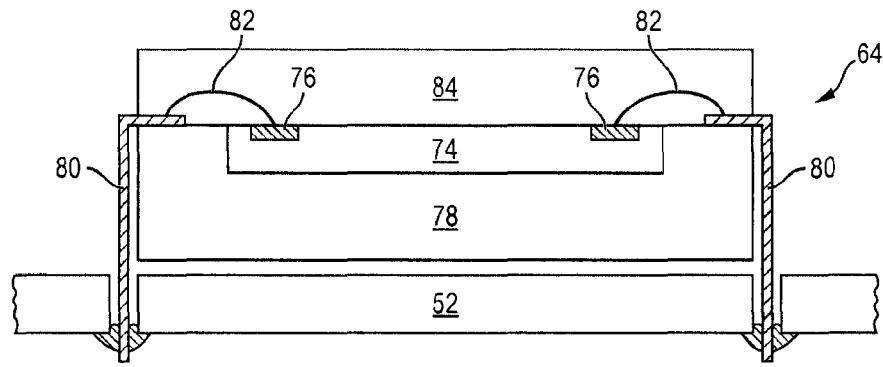
FIGS. 3a-3c illustrate further detail of the representative semiconductor packages mounted to the PCB.
Figure 3B:
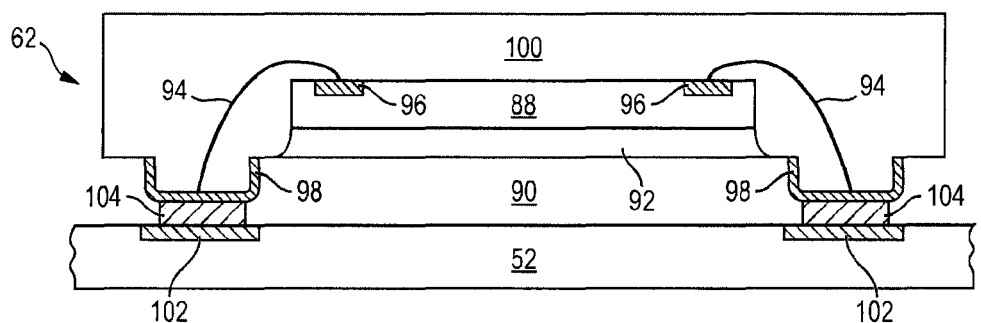
Figure 3C:
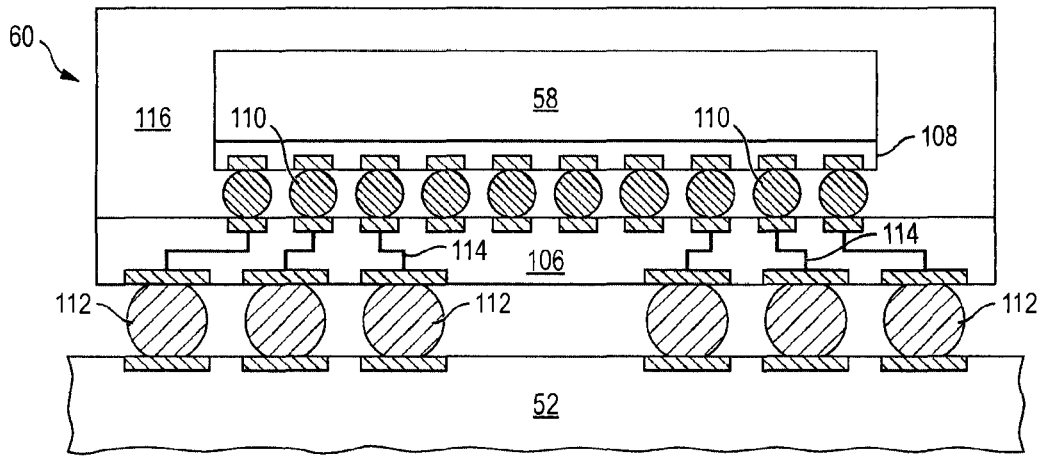

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
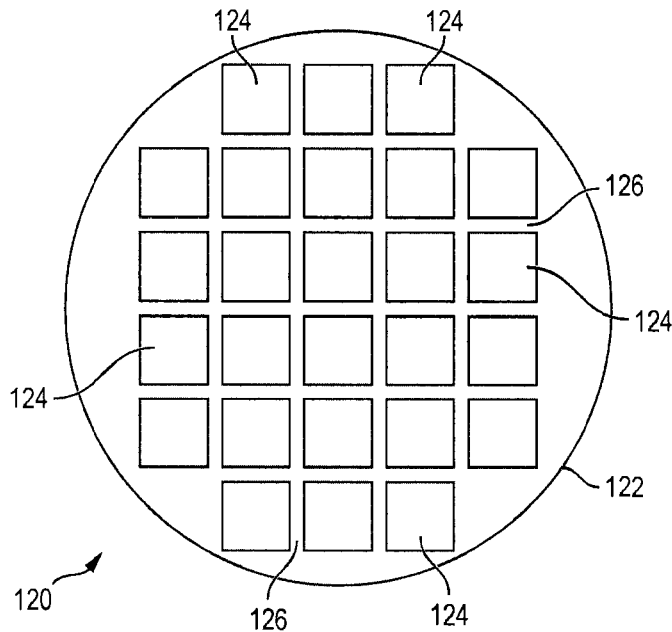
FIGS. 4a-4c illustrate a semiconductor wafer with a plurality of semiconductor die separated by a saw street.

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 4B:
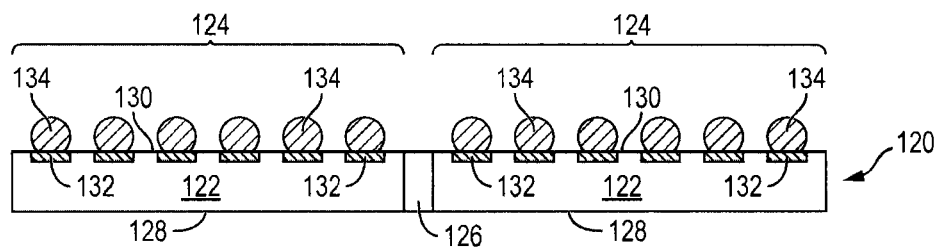

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 4b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded or thermocompression bonded to contact pads 132. Bumps 134 represent one type of interconnect structure that can be formed over contact pads 132. The interconnect structure can also use stud bump, micro bump, or other electrical interconnect.

Figure 4C:
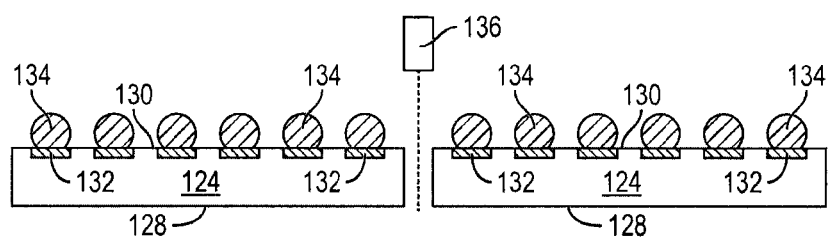

In FIG. 4c, semiconductor wafer 120 is singulated through saw street 126 using a saw blade or laser cutting tool 136 into individual semiconductor die 124.

Figure 5C:
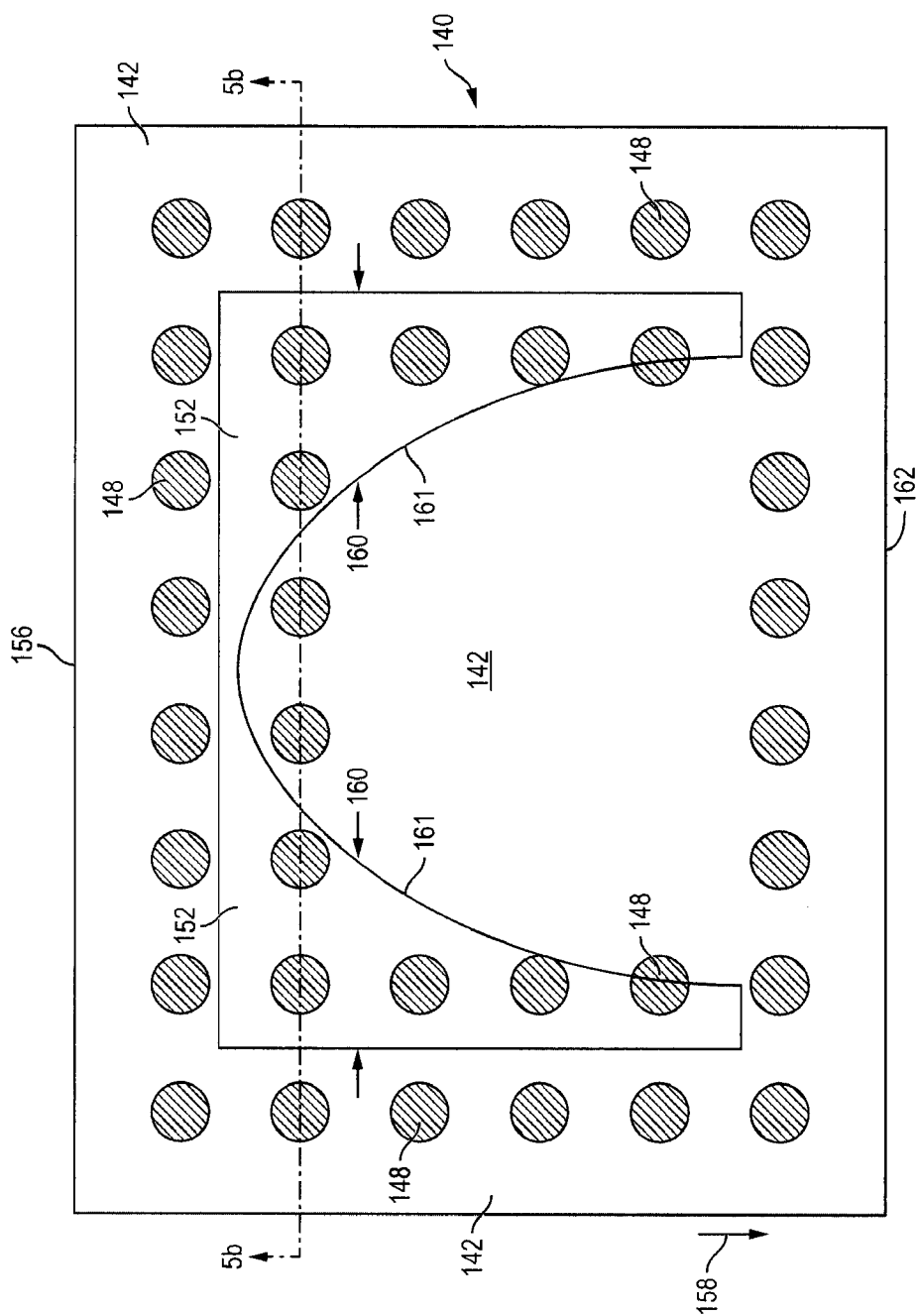

FIGS. 5a-5k illustrate, in relation to FIGS. 2 and 3a-3c, a process of depositing an underfill material between a semiconductor die and substrate having openings for a uniform flow rate. FIG. 5a shows substrate 140 including a base substrate material 141, such as metal, silicon, polymer, polymer composite, ceramic, glass, glass epoxy, beryllium oxide, or other suitable low-cost, rigid material or bulk semiconductor material for structural support.

An insulating layer or passivation layer 142 is formed over a surface of base substrate material 141 using PVD, CVD, screen printing, spin coating, spray coating, sintering or thermal oxidation. Likewise, an insulating layer or passivation layer 144 is formed over an opposing surface of base substrate material 141 using PVD, CVD, screen printing, spin coating, spray coating, sintering or thermal oxidation. The insulating layers 142 and 144 contain one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. In one embodiment, insulating layers 142 and 144 are photoresist layers or solder resist layers.

A plurality of vias is formed through substrate 140 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form vertical interconnect conductive vias 146.

An electrically conductive layer or redistribution layer (RDL) 148 is formed over or within insulating layer 142 and over conductive vias 146 using a patterning and metal deposition process such as printing, PVD, CVD, sputtering, electrolytic plating, and electroless plating. Likewise, an electrically conductive layer or RDL 150 is formed over or within insulating layer 144 and over conductive vias 146 using a patterning and metal deposition process such as printing, PVD, CVD, sputtering, electrolytic plating, and electroless plating. Conductive layers 148 and 150 can be one or more layers of Al, Cu, Sn, Ni, Au, Ag, or other suitable electrically conductive material. Conductive layers 148 and 150 are electrically connected to conductive vias 146. Alternatively, conductive layers 148 and 150 can be formed prior to conductive vias 146.

In FIG. 5b, a plurality of openings 152 is formed in insulating layer 142 using an etching process. Alternatively, openings 152 are formed in insulating layer 142 by laser direct ablation (LDA) using laser 154. The removal of insulating layer 142 does not remove conductive layer 148. The openings 152 in insulating layer 142 leave conductive layer 148 intact for electrical interconnect. FIG. 5c shows a plan view of openings 152 formed in insulating layer 142 of substrate 140. The openings 152 are widest along edge 156 of substrate 140. The openings 152 extend from proximate to edge 156 along length 158 of substrate 140 and narrow in width 160 with a non-linear side or edge 161 in the direction of edge 162 of the substrate. In one embodiment, openings 152 have a depth of 10-20 micrometers (μm). The openings 152 in insulating layer 142 leave conductive layer 148 intact for electrical interconnect.

Figure 5D:
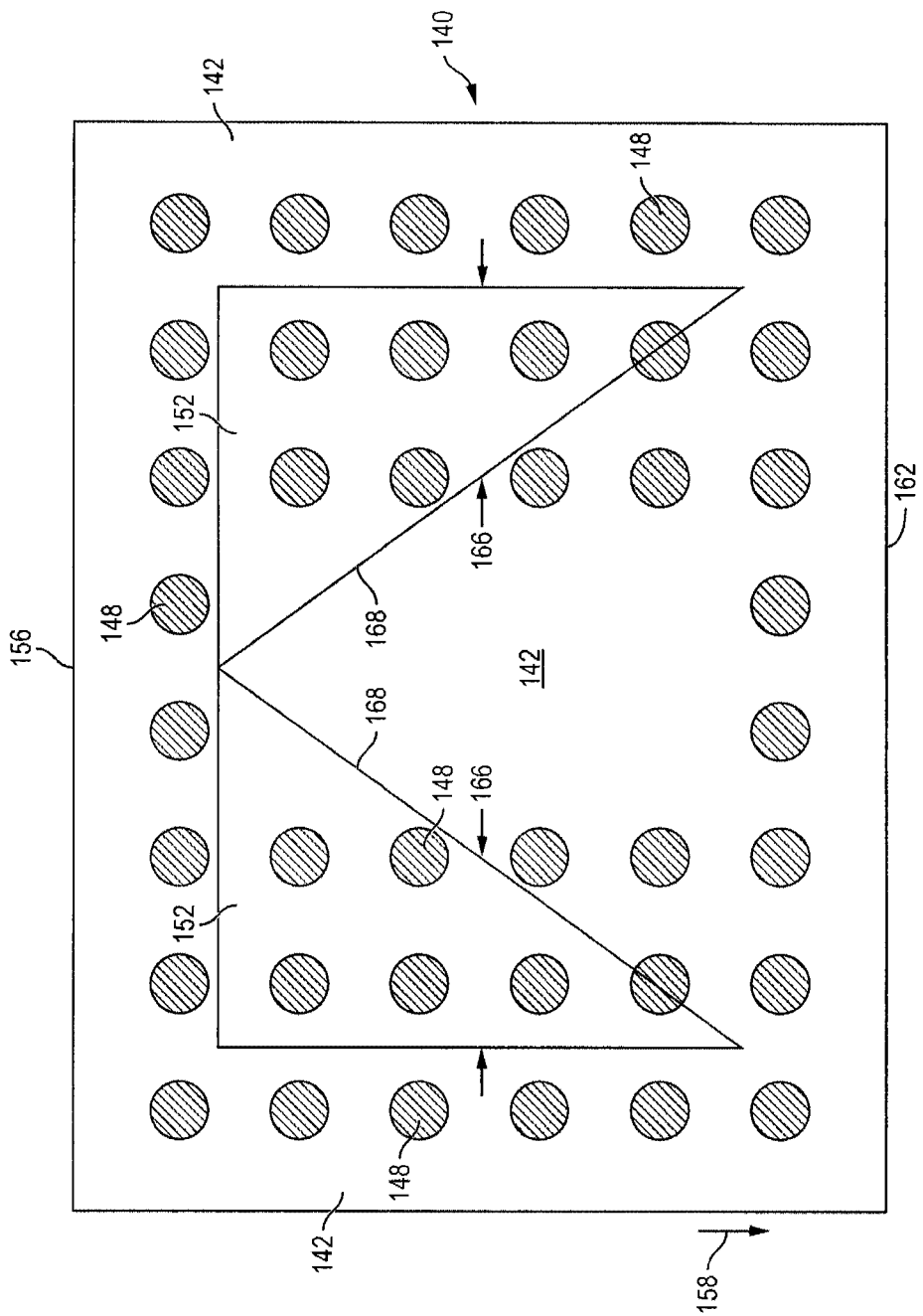
Figure 5E:
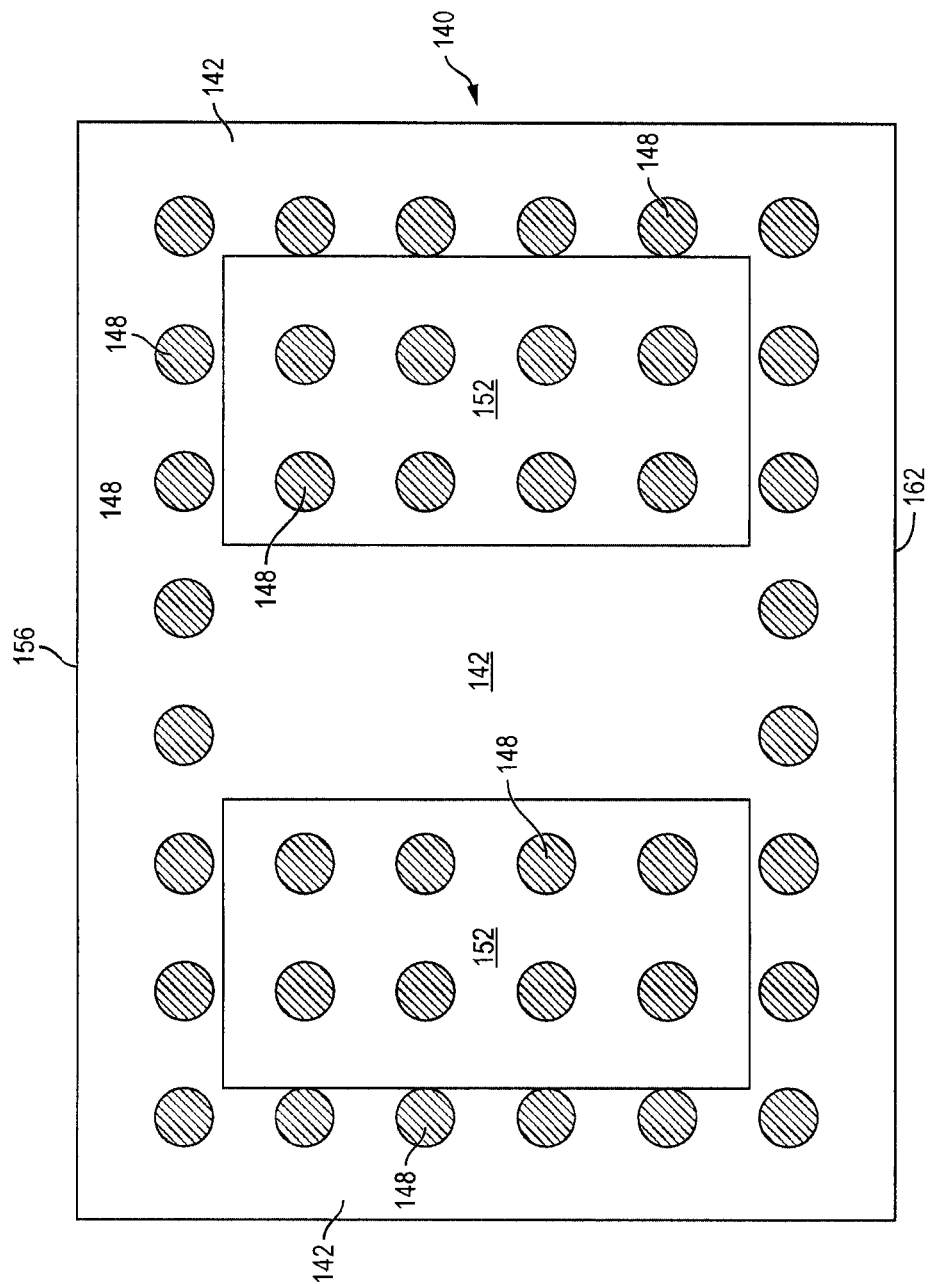
Figure 5F:
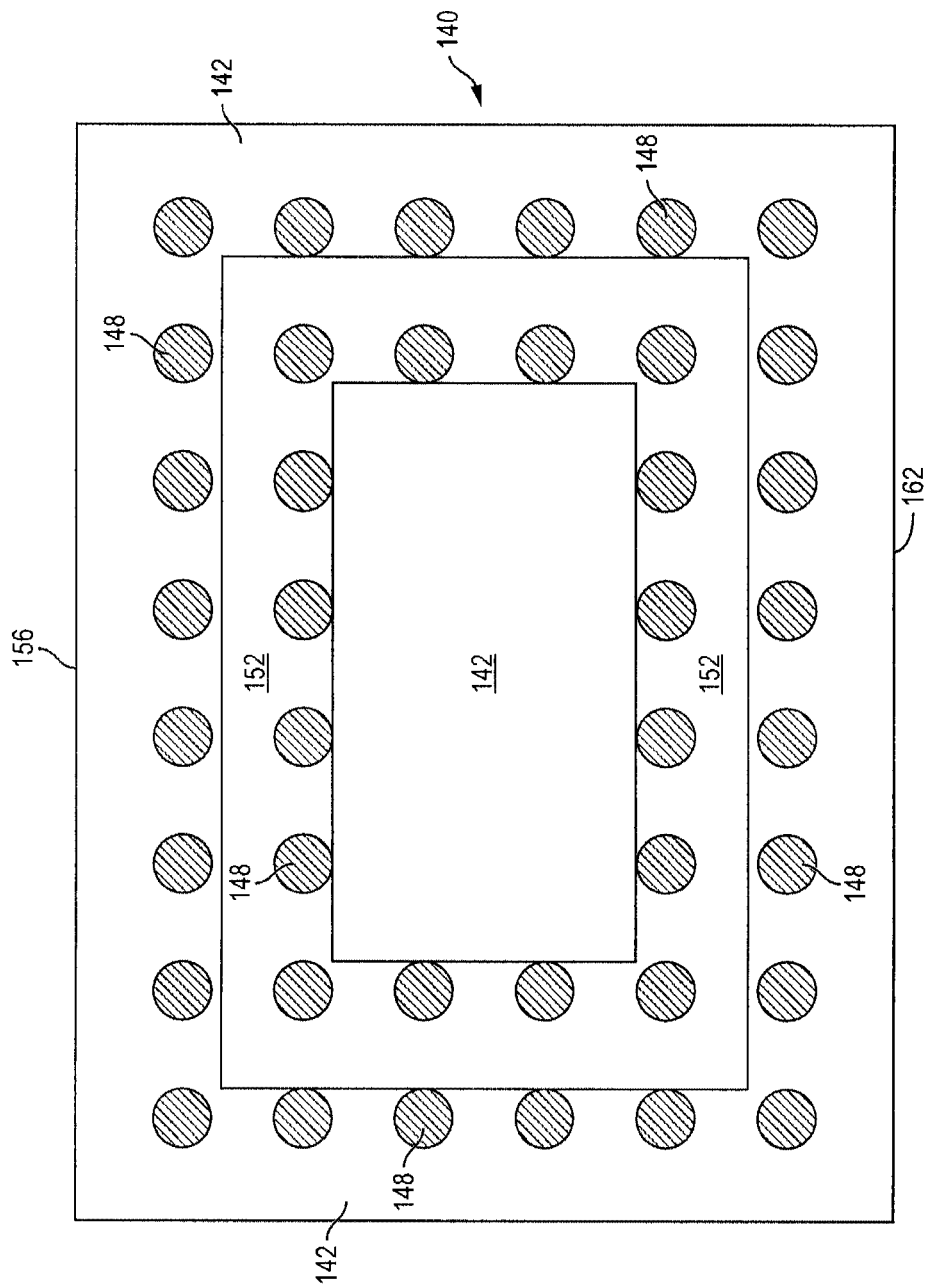

FIG. 5d shows a plan view of an embodiment of openings 152 extending from proximate to edge 156 along length 158 of substrate 140 and narrowing in width 166 in a linear fashion with a linear side or edge 168 in the direction of edge 162. FIG. 5e shows a plan view of an embodiment of openings 152 having a rectangular shape from proximate to edge 156 to proximate to edge 162. FIG. 5f shows a plan view of an embodiment of a continuous opening 152 having a box shape with solid central region of insulating layer 142.

Figure 5G:
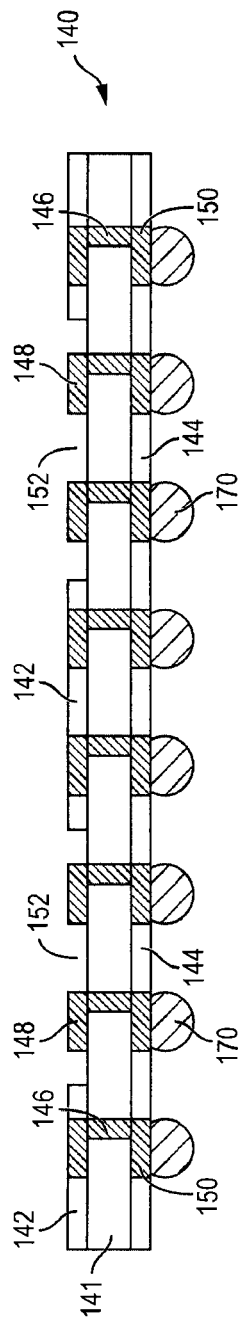

In FIG. 5g, an electrically conductive bump material is deposited over conductive layer 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 170. In some applications, bumps 170 are reflowed a second time to improve electrical contact to conductive layer 150. Bumps 170 can also be compression bonded or thermocompression bonded to conductive layer 150. Bumps 170 represent one type of interconnect structure that can be formed over conductive layer 170. The interconnect structure can also use stud bump, micro bump, or other electrical interconnect.

Figure 5H:
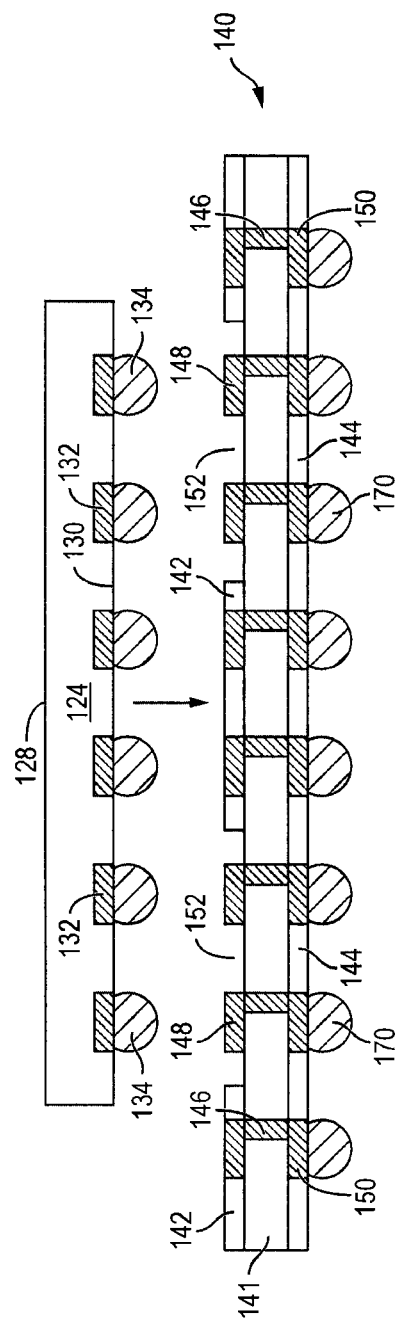
Figure 5I:
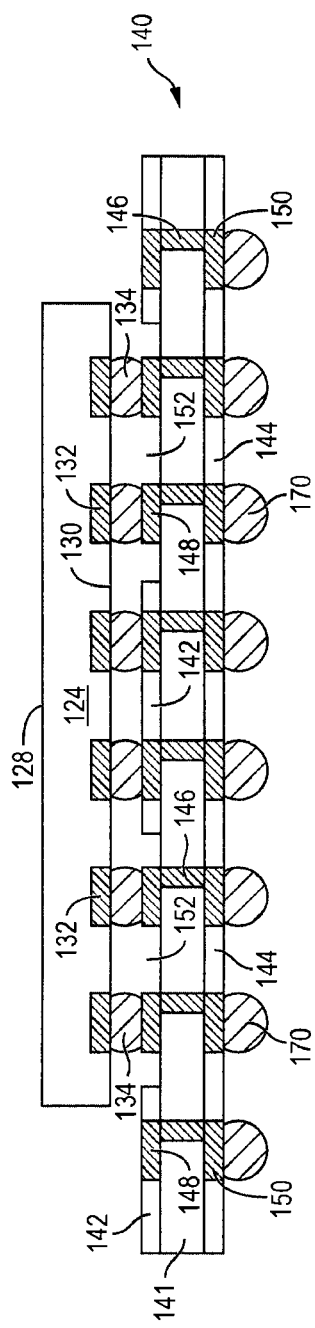

In FIG. 5h, semiconductor die 124 from FIG. 4c is positioned over substrate 140 with bumps 134 aligned with conductive layer 148. Semiconductor die 124 is mounted to substrate 140 by electrically and metallurgically connecting bumps 134 to conductive layer 148. FIG. 5i shows semiconductor die 124 mounted to substrate 140. The circuits on active surface 130 of semiconductor die 124 are electrically connected through conductive layer 132, bumps 134, conductive vias 146, and conductive layers 148-150 to bumps 170.

Figure 5J:
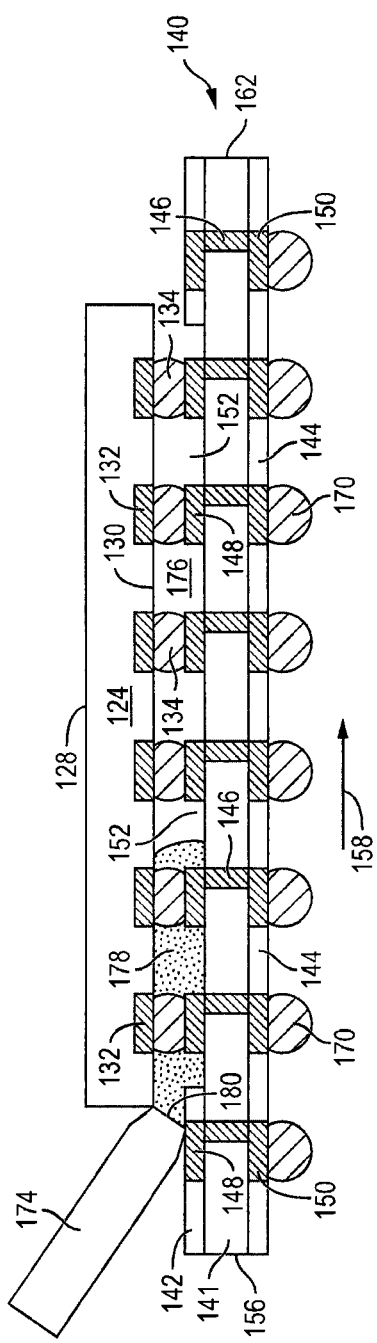

FIG. 5j shows an underfill dispenser 174 placed in fluid communication with area 176 between semiconductor die 124 and substrate 140. Semiconductor die 124 and substrate 140 are oriented with edges 156 and 162 to the left and right of the figure. The opening 152 with non-linear width 156 from FIG. 5c extends along length 158 of substrate 140. A capillary underfill material (CUF) or encapsulant material 178 is injected under pressure from outlet 180 of dispenser 174 into area 176 between semiconductor die 124 and substrate 140 around bumps 170. CUF 178 can be polymer composite material, such as epoxy resin with filler, epoxy acrylate with filler, or polymer with proper filler. CUF 178 is non-conductive and environmentally protects the semiconductor device from external elements and contaminants.

Figure 5K:
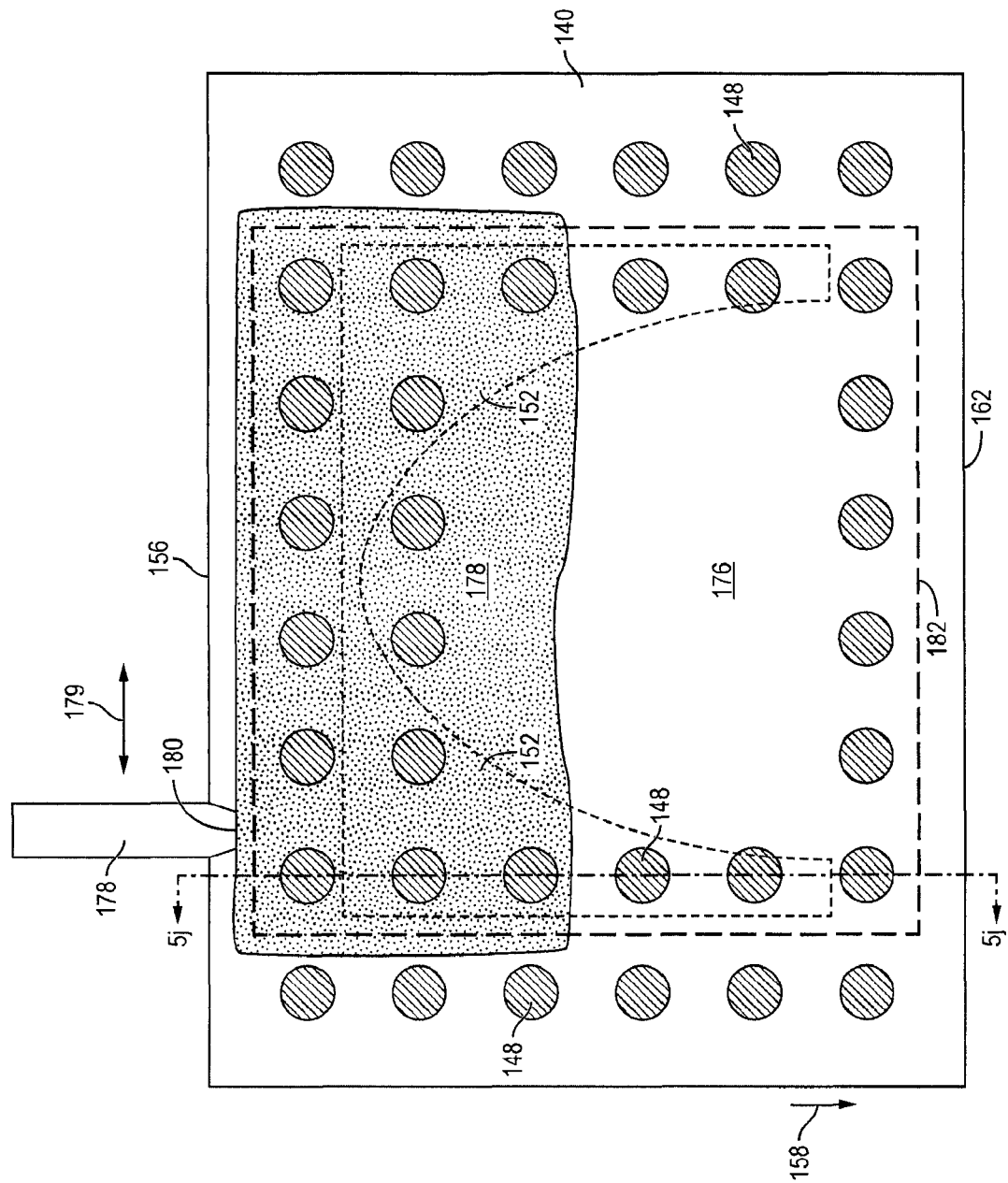

FIG. 5k shows a plan view of CUF 178 filling area 176 in the direction of length 158 between semiconductor die site 182 and substrate 140 around bumps 170. Dispenser 174 moves back and forth along edge 156 to inject CUF 178 into area 176 under pressure, as shown by arrows 179. As noted in the background, the flow rate of underfill material is usually non-uniform over the substrate. That is, the flow rate of the underfill material is higher in some areas of the substrate and lower in other areas of the substrate. The flow rate is effective higher around the bump placement due to the reduced volume to fill, i.e. the bumps occupy space. The openings 152 are disposed in areas of substrate 140 that would otherwise have a higher flow rate, i.e., around bumps 170. The openings 152 increase the volume of space to be filled by CUF 178 and accordingly decrease or alter the flow rate of CUF 178 in area 176 proximate to openings 152. The effect of openings 152 is to decrease or alter the flow rate of CUF 178 in area 176 proximate to openings 152 to a value substantially the same as the flow rate of CUF 178 in area 176 away from openings 152. The decrease in the flow rate of CUF 178 in area 176 proximate to openings 152 results in a more uniform flow rate of CUF 178 across the entire surface of substrate 140 for a complete and even coverage in area 176. The uniform flow rate of CUF 178 in area 176 reduces void formation and bleed-out of excess CUF 178 from area 176.

Figure 6:
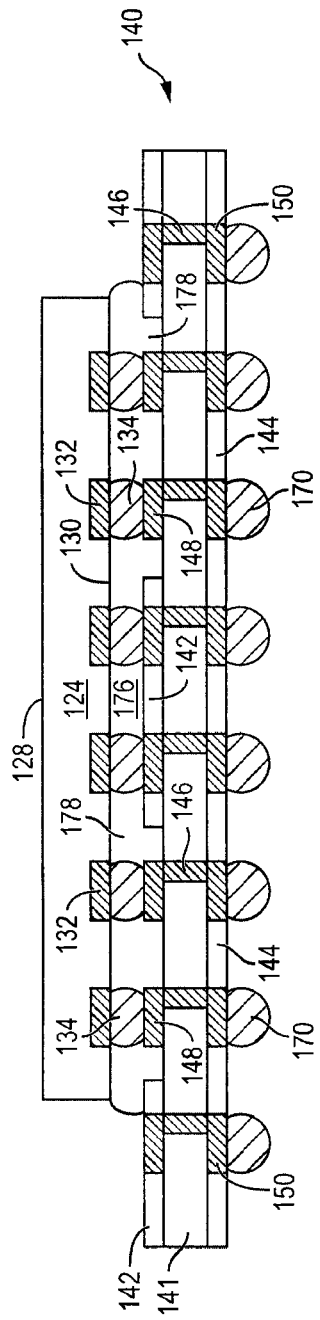
FIG. 6 illustrates an underfill material deposited between the semiconductor die and substrate having openings for a uniform flow rate.

FIG. 6 shows CUF 178 deposited in area 176 between semiconductor die 124 and substrate 140 without forming voids. The openings 152 decrease the flow rate of CUF 178 in area 176 proximate to openings 152 to a value substantially the same as the flow rate of CUF 178 in area 176 away from openings 152 for a uniform flow rate of CUF 178 across the entire surface of substrate 140. The openings 152 provide a complete and even coverage of CUF 178 in area 176.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming an insulating layer over a first surface of the substrate;
   forming a plurality of openings in the insulating layer;
   providing a semiconductor die including a first region with a first bump density and a second region with a second bump density less than the first bump density;
   disposing the semiconductor die over the first surface of the substrate; and
   depositing an underfill material between the semiconductor die and substrate, wherein the openings in the insulating layer reduce a flow rate of the underfill material proximate to the openings.

2. The method of claim 1, wherein the flow rate of the underfill material proximate to the openings is substantially equal to a flow rate of the underfill material away from the openings.

3. The method of claim 1, further including:
   forming a first conductive layer over the first surface of the substrate; and
   forming the opening in the insulating layer while leaving the first conductive layer intact.

4. The method of claim 3, further including:
  forming a second conductive layer over a second surface of the substrate opposite the first surface of the substrate; and
  forming a conductive via through the substrate electrically connected to the first conductive layer and second conductive layer.

5. The method of claim 1, further including forming the openings to narrow with a non-linear side.

6. The method of claim 1, further including forming the openings to narrow with a linear side.

7. A method of making a semiconductor device, comprising:
  providing a substrate;
  forming an opening in the substrate;
  providing a semiconductor die;
  disposing the semiconductor die over the substrate; and
  depositing an underfill material between the semiconductor die and substrate, wherein the opening in the substrate reduces a flow rate of the underfill material proximate to the opening.

8. The method of claim 7, wherein the flow rate of the underfill material proximate to the opening is substantially equal to a flow rate of the underfill material away from the opening.

9. The method of claim 7, wherein providing the substrate further includes:
  providing a base material;
  forming an insulating layer over a first surface of the base material; and
  forming a first conductive layer over the first surface of the base material.

10. The method of claim 9, further including:
  forming a second conductive layer over a second surface of the base material opposite the first surface of the base material; and
  forming a conductive via through the substrate electrically connected to the first conductive layer and second conductive layer.

11. The method of claim 7, further including forming the opening to narrow with a non-linear side.

12. The method of claim 7, further including forming the opening to narrow with a linear side.

13. The method of claim 7, further including forming the opening to include a rectangular shape.

14. A method of making a semiconductor device, comprising:
  providing a substrate;
  removing a portion of a first surface of the substrate to form an opening while leaving a second surface of the substrate opposite the first surface intact;
  disposing a semiconductor die over the substrate; and
  depositing an underfill material between the semiconductor die and substrate and into the opening in the substrate, wherein the opening in the substrate reduces a flow rate of the underfill material proximate to the opening.

15. The method of claim 14, wherein the flow rate of the underfill material proximate to the opening is substantially equal to a flow rate of the underfill material away from the opening.

16. The method of claim 14, wherein providing the substrate further includes:
  providing a base material;
  forming an insulating layer over a surface of the base material; and
  forming a conductive layer over the surface of the base material.

17. The method of claim 14, further including forming the opening to narrow with a non-linear side.

18. The method of claim 14, further including forming the opening to narrow with a linear side.

19. The method of claim 14, further including forming the opening to include a rectangular shape.

20. A method of making a semiconductor device, comprising:
  providing a substrate;
  forming an opening partially through the substrate;
  disposing a semiconductor die over the substrate; and
  depositing an underfill material between the semiconductor die and substrate, wherein a flow rate of the underfill material proximate to the opening is substantially equal to a flow rate of the underfill material away from the opening.

21. The method of claim 20, wherein providing the substrate further includes:
  providing a base material;
  forming an insulating layer over a surface of the base material; and
  forming a conductive layer over the surface of the base material.

22. The method of claim 20, further including forming the opening to narrow with a non-linear side.

23. The method of claim 20, further including forming the opening to narrow with a linear side.

24. The method of claim 9, wherein forming the opening in the substrate further includes forming the opening in the insulating layer while leaving the first conductive layer intact.

25. The method of claim 16, wherein removing the portion of the substrate further includes removing a portion of the insulating layer while leaving the conductive layer intact.

26. The method of claim 20, wherein forming the opening in the substrate further includes forming the opening in the insulating layer while leaving the conductive layer intact.

* * * * *